(12) United States Patent
Dunham et al.

(10) Patent No.: US 7,312,141 B2
(45) Date of Patent: Dec. 25, 2007

(54) SHAPES-BASED MIGRATION OF ALUMINUM DESIGNS TO COPPER DAMASCENE

(75) Inventors: Timothy G. Dunham, South Burlington, VT (US); Ezra D. B. Hall, Richmond, VT (US); Howard S. Landis, Underhill, VT (US); Mark A. Lavin, Katonah, NY (US); William C. Leipold, Enosburg Falls, VT (US)

(73) Assignee: International Business Machines Corporation, Armonk, NY (US)

( * ) Notice: Subject to any disclaimer, the term of this patent is extended or adjusted under 35 U.S.C. 154(b) by 146 days.

(21) Appl. No.: 11/256,025

(22) Filed: Oct. 21, 2005

(65) Prior Publication Data

US 2006/0081988 A1  Apr. 20, 2006

Related U.S. Application Data

(60) Continuation-in-part of application No. 10/305,644, filed on Nov. 26, 2002, now Pat. No. 6,992,002, which is a division of application No. 09/670,411, filed on Sep. 26, 2000, now Pat. No. 6,528,883.

(51) Int. Cl.
    H01L 21/44 (2006.01)
(52) U.S. Cl. .............................. 438/597; 257/E21.575
(58) Field of Classification Search ................ 438/597, 438/128
    See application file for complete search history.

(56) References Cited

U.S. PATENT DOCUMENTS

| | | |
|---|---|---|
| 5,101,261 A | 3/1992 | Maeda |
| 5,459,093 A | 10/1995 | Kuroda et al. |
| 5,470,788 A | 11/1995 | Biery et al. |
| 5,494,853 A | 2/1996 | Lur |
| 5,556,805 A | 9/1996 | Tanizawa et al. |
| 5,610,831 A | 3/1997 | Matsumoto |
| 5,620,916 A | 4/1997 | Eden et al. |
| 5,633,198 A | 5/1997 | Lur et al. |
| 5,759,906 A | 6/1998 | Lou |
| 5,770,518 A | 6/1998 | Shen |
| 5,811,352 A | 9/1998 | Numata et al. |
| 5,861,342 A | 1/1999 | Gabriel et al. |
| 5,888,897 A | 3/1999 | Liang |
| 5,899,706 A | 5/1999 | Kluwe et al. |
| 5,915,203 A | 6/1999 | Sengupta et al. |
| 5,923,563 A | 7/1999 | Lavin et al. |
| 5,930,668 A | 7/1999 | Gardner |
| 5,956,618 A | 9/1999 | Liu et al. |
| 5,963,831 A | 10/1999 | Fu |
| 5,970,376 A | 10/1999 | Chen |
| 5,981,376 A | 11/1999 | Komatsu et al. |
| 5,981,384 A | 11/1999 | Juengling |

(Continued)

FOREIGN PATENT DOCUMENTS

EP   744633 A2   11/1996

*Primary Examiner*—Scott B. Geyer
*Assistant Examiner*—Elias Ullah
(74) *Attorney, Agent, or Firm*—Schmeiser, Olsen & Watts; William H. Steinberg

(57) ABSTRACT

An interconnect structure, method of fabricating the interconnect structure and method of designing the interconnect structure for use in semiconductor devices. The interconnect structure includes a damascene metal wire having a pattern of dielectric filled holes.

17 Claims, 10 Drawing Sheets

U.S. PATENT DOCUMENTS

| | | |
|---|---|---|
| 6,022,804 A | 2/2000 | Yano et al. |
| 6,093,633 A | 7/2000 | Matsumoto |
| 6,100,589 A | 8/2000 | Tanaka |
| 6,168,726 B1 * | 1/2001 | Li et al. .................. 216/79 |
| 6,218,720 B1 * | 4/2001 | Gardner et al. ............ 257/510 |
| 6,624,063 B2 | 9/2003 | Hasegawa et al. |

* cited by examiner

SHAPES-BASED MIGRATION OF ALUMINUM DESIGNS TO COPPER DAMASCENE

RELATED APPLICATIONS

This application is a continuation-in-part of application Ser. No. 10/305,644 filed on Nov. 26, 2002, now U.S. Pat. No. 6,992,002, which is a divisional of application Ser. No. 09/670,411 filed on Sep. 26, 2000, now U.S. Pat. No. 6,528,883.

TECHNICAL FIELD

The present invention relates generally to the field of semiconductor device formation, and more specifically to structures which interconnect a plurality of metal wiring layers by incorporating dummy shapes and voids therein, as well as to the method by which such structures may be manufactured.

BACKGROUND OF THE INVENTION

Copper damascene processes are incompatible with some aspects of industry standard aluminum-based design layouts. Specifically, wide metal wires, wide regions devoid of metal wires (i.e., "whitespace"), local regions of high metal-pattern-density, and local regions of low metal-pattern-density are all incompatible with state of the art in copper damascene processing. Consequently, the interconnect levels of semiconductor designs must be redrawn in order to accommodate the aforementioned limitations of damascene copper, specifically by following maximum-linewidth rules, wide-line/wide-space rules, and local metal-pattern-density rules. These constraints on interconnect layouts are a significant obstacle to the utilization of damascene copper processes.

The related art generally uses one of two methods to produce a connection between areas of high via concentration (i.e., "via farms") and copper damascene layers in a semiconductor device. These two methods differ in their respective approaches to existing via farms. The first method does not allow any via farms, while the second method rebuilds most or all of the via farms.

In the first method, via farms are not allowed. Instead, only a single row of vias is allowed around the perimeter of the intersection of wide metal wires. This approach requires that industry-standardized designs be manually adjusted to remove "farm" vias, and subsequently retimed because the total via resistance for a large farm can be much less than the total via resistance for a single ring of vias along the perimeter.

The second method requires the rebuilding of all via farms. A design tool may be applied to the semiconductor device design. The design tool, such as those known in the art, may identify intersections of wide metal connected by vias, remove all vias from the intersection, and replace the vias in a preferred configuration (e.g., a single or double row at the perimeter of the intersection). However, there are two major drawbacks with this method. First, a large proportion of the via shapes are removed from any large via farm. Second, the design data is altered. Removing and replacing a large number of via shapes can have an unpredictable effect, both on the run-time, and on the results of subsequent verification procedures such as Design Rule Checking (DRC) and Layout Versus Schematic (LVS) checking.

SUMMARY OF THE INVENTION

The invention disclosed herein presents a process and related structures that allow migration of industry-standard aluminum-based layouts to copper damascene, based solely on shapes-information (i.e., no net-list analysis is required). This method and its attendant structures have the added property of leaving all the customer's design shapes unaltered. Metal fill (MxFILL) shapes and metal hole (MxHOLE) shapes for metal level (Mx) are added to the design (where "x" denotes the number of a layer), but the customer's shapes and the hierarchy of the customer's design are left unaltered.

Specifically, metal fill shapes (i.e., small electrically-isolated "dummy" metal shapes that are placed in otherwise empty regions), and metal hole shapes (i.e., small isolated "holes" that are cut from the interior of wide metal wires) are used to satisfy all of the copper damascene-specific ground rules.

By judicious choice of the size and placement of these fill and hole shapes, it is possible to make their addition virtually transparent to the customer's design. That is, the electrical behavior of a design utilizing both metal fill and metal hole shapes can be made to behave in a manner entirely consistent with modeled electrical behavior of the design without regard to the specific placement of fill and hole shapes.

The present invention provides a method to produce a connection between via farms and copper damascene layers in a semiconductor device by initially deriving via farms, and next allowing MxHOLE shapes to be placed on the interior of via farms without regard to the exact location of the vias located there.

The present invention can be fully automated, is entirely shapes-based (i.e., does not require net-list building), leaves the customer's design data unaltered (only adding shapes to MxFILL and MxHOLE), and preserves the majority of the via and hole area within the interior of so-defined via farms. This approach transparently accommodates a wide variety of via farm layouts, and by construction satisfies the via electromigration requirements for wide copper lines. Furthermore, because a "typical" via is at the end of a minimum-width wire, and contacts the end of another minimum-width wire below, the nominal via resistance is quite high, and the tolerance, particularly for high resistance is very large. Most of the factors that tend to increase the resistance of a typical via are not applicable to a via which is fully landed in a wide metal layer. Indeed, the specified nominal resistance of a via farm will generally be much greater than the measured resistance of the via farm, even with a fraction of the interior vias landing on metal holes.

A first aspect of the present invention is an integrated circuit, comprising: a dielectric layer having a bottom surface disposed over a semiconductor substrate, the dielectric layer having a metal filled trench filled with a layer of metal, the dielectric layer having a set of metal fill shapes filled with the layer of metal, the metal filled trench and the set of metal fill shapes extending from a top surface of the dielectric layer toward the bottom surface of the dielectric layer, the metal fill shapes arranged in a first pattern; and a plurality of dielectric pedestals disposed in the metal filled trench, the dielectric pedestals filled with the dielectric layer, the dielectric pedestals extending from a top surface of the metal filled trench to a bottom surface of the metal filled trench, the dielectric pedestals arranged in a second pattern, wherein the second pattern is an offset-grid, the offset grid having a pitch defined by a width of the metal filled trench.

A second aspect of the present invention is a method of manufacturing an integrated circuit, comprising: providing a dielectric layer having a bottom surface disposed over a semiconductor substrate; forming a metal trench filled with a layer of metal in the dielectric layer and forming a set of metal fill shapes filled with the layer of metal in the dielectric layer, the metal filled trench and the set of metal fill shapes extending from a top surface of the dielectric layer toward the bottom surface of the dielectric layer, the metal fill shapes arranged in a first pattern; and forming a plurality of dielectric pedestals disposed in the metal filled trench, the dielectric pedestals filled with the dielectric layer, the dielectric pedestals extending from a top surface of the metal filled trench to a bottom surface of the metal filled trench, the dielectric pedestals arranged in a second pattern, wherein the second pattern is an offset-grid, the offset grid having a pitch defined by a width of the metal filled trench.

A third aspect of the present invention is an integrated circuit, comprising: a dielectric layer having a bottom surface disposed over a semiconductor substrate; a metal filled trench filled with a layer of metal disposed in the dielectric layer, the metal filled trench extending from a top surface of the dielectric layer toward the bottom surface of the dielectric layer; and a plurality of square dielectric pedestals disposed in the metal filled trench, the dielectric pedestals filled with the dielectric layer, the dielectric pedestals extending from a top surface of the metal filled trench to a bottom surface of the metal filled trench.

A fourth aspect of the present invention is a method of manufacturing an integrated circuit, comprising: providing a dielectric layer having a bottom surface disposed over a semiconductor substrate; forming a metal filled trench filled with a layer of metal in the dielectric layer, the metal filled trench extending from a top surface of the dielectric layer toward the bottom surface of the dielectric layer; and forming a plurality of square dielectric pedestals in the metal filled trench, the dielectric pedestals filled with the dielectric layer, the dielectric pedestals extending from a top surface of the metal filled trench to a bottom surface of the metal filled trench.

A fifth aspect of the present invention is a method of designing an integrated circuit, comprising: generating a wiring level design of each wiring level and a via level design of each via level of the integrated circuit, each wiring level design having wire shapes, each via level design having via shapes; for each wiring level design, determining empty regions, the empty regions devoid of wire shapes; for each wiring level design, generating metal fill shapes and a metal fill shape grid; for each wiring level design, determining first and second regions of wire shapes; for each wiring level design, generating metal hole shapes and a metal hole shape grid; for each wiring level design, placing the generated metal fill shapes between the wire shapes in corresponding empty regions and on a corresponding metal fill shape grid; and for each wiring level design, placing the generated metal hole shapes within the wire shapes in corresponding second regions of wire shape on a corresponding hole fill shape grid.

DETAILED DESCRIPTION OF THE INVENTION

A damascene process is one in which wire trenches or via openings are formed in a dielectric layer, an electrical conductor of sufficient thickness to, fill the trenches or via openings is deposited on a top surface of the dielectric, and a chemical-mechanical-polish (CMP) process is performed to remove excess conductor and make the surface of the conductor co-planer with the surface of the dielectric layer to form a damascene wires (or damascene vias). When only a trench and a wire (or a via opening and a via) is formed the process is called single-damascene.

A dual-damascene process is one in which via openings are formed through the entire thickness of a dielectric layer followed by formation of trenches part of the way through the dielectric layer in any given cross-sectional view. Alternatively, the trenches may be formed first. All via openings are intersected by integral wire trenches above and by a wire trench below, but not all trenches need intersect a via opening. An electrical conductor of sufficient thickness to fill the trenches and via opening is deposited on a top surface of the dielectric and a CMU process is performed to make the surface of the conductor in the trench co-planer with the surface the dielectric layer to form dual-damascene wires and dual-damascene wires having integral dual-damascene vias.

Metal fill shapes are single-damascene or dual-damascene structures made concurrently with single-damascene or dual-damascene wires and vias in a wiring level, but are not electrically connected to any "real" or functional wire or vias that carry power or signals in the same wiring level as the metal fill shape or to any wire, via in other wiring levels. Metal fill shapes in one wiring level may or may not physically and electrically connect to metal fill shapes in adjacent wiring levels.

As will be described infra, metal hole shapes are similar to metal fill shapes, except metal hole shapes are distributed through a metal layer and result in pedestals of the dielectric layer within damascene or dual-damascene wires.

Prior to the first step in the method of the invention, the desired design is assembled using industry-standard layout tools and practices.

Figure 10A:
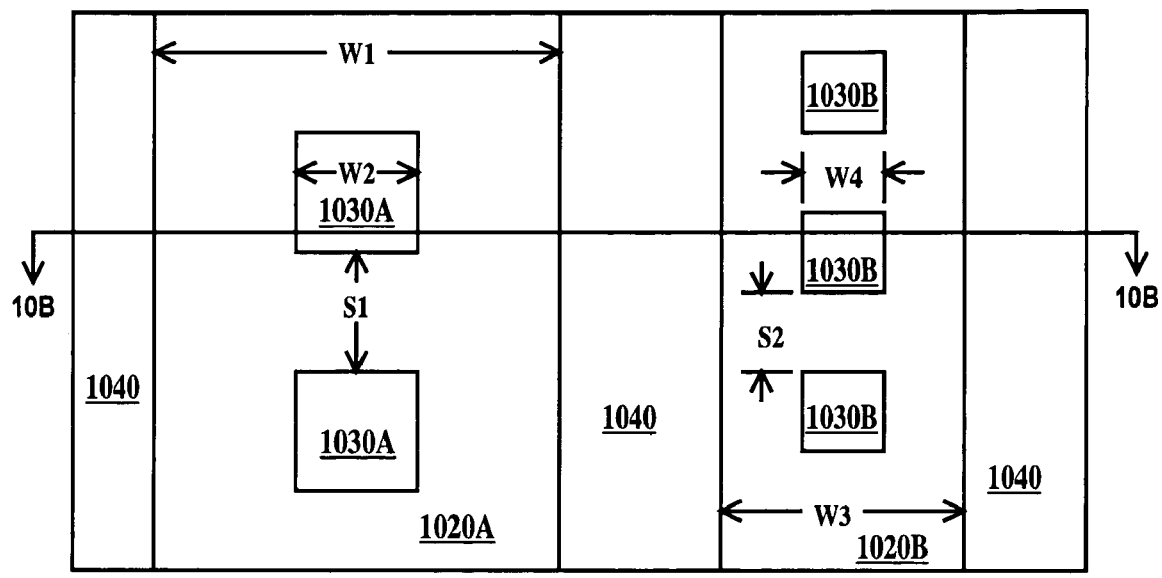
FIG. 10A is a plan view and FIG. 10B is a cross-section through line 10B-10B of FIG. 10A of a physical representation of the present invention.
Figure 10B:
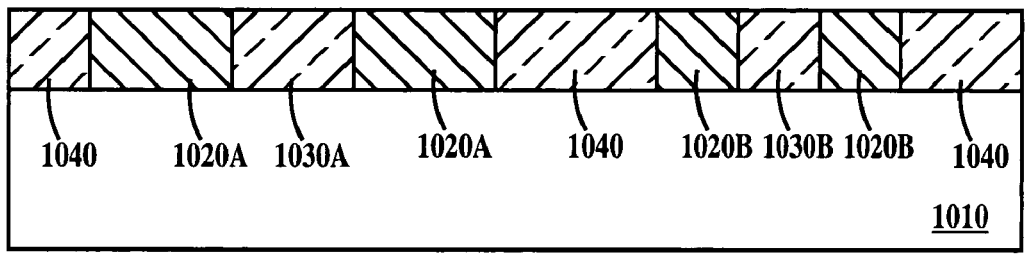

FIG. 10A is a plan view and FIG. 10B is a cross-section through line 10B-10B of

FIG. 10A of a physical representation of the present invention. The invention is performed on a semiconductor design as rendered in FIG. 10 which includes a substrate 1010, typically silicon, upon which is a dielectric layer 1040. Formed within the dielectric layer 1040 are metal (e.g., copper) wires 1020A and 1020B. Dielectric pedestals 1030A and 1030B are formed within respective metal wires 1020A and 1020B. Dielectric pedestals 1030 are formed from dielectric layer 1040 and correspond to metal hole shapes of the embodiments of the present invention.

Figure 7:
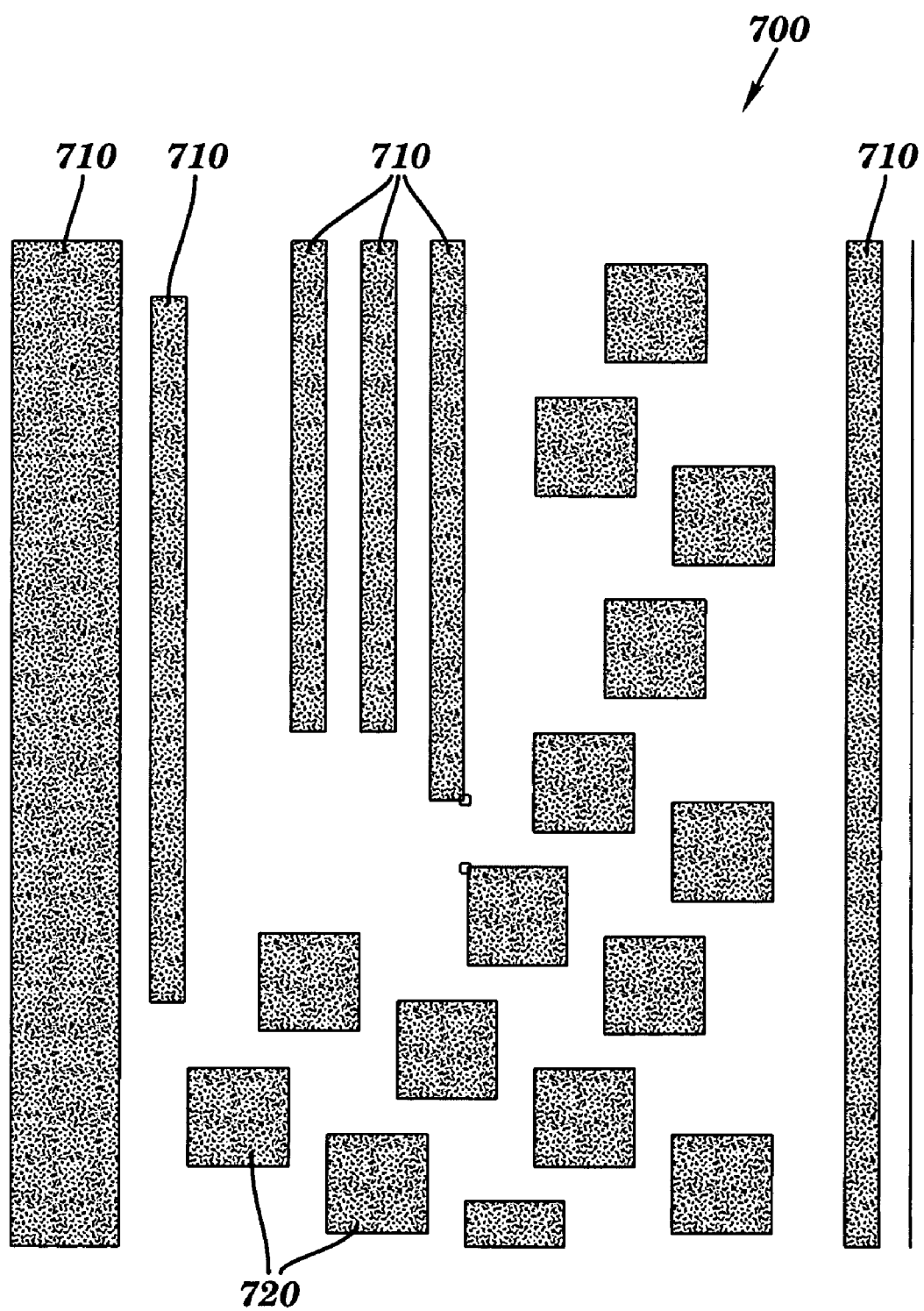
FIG. 7 is a plan view of a typical MxFILL pattern, size and grid wherein "real" metal shapes are included for reference.
Figure 9:
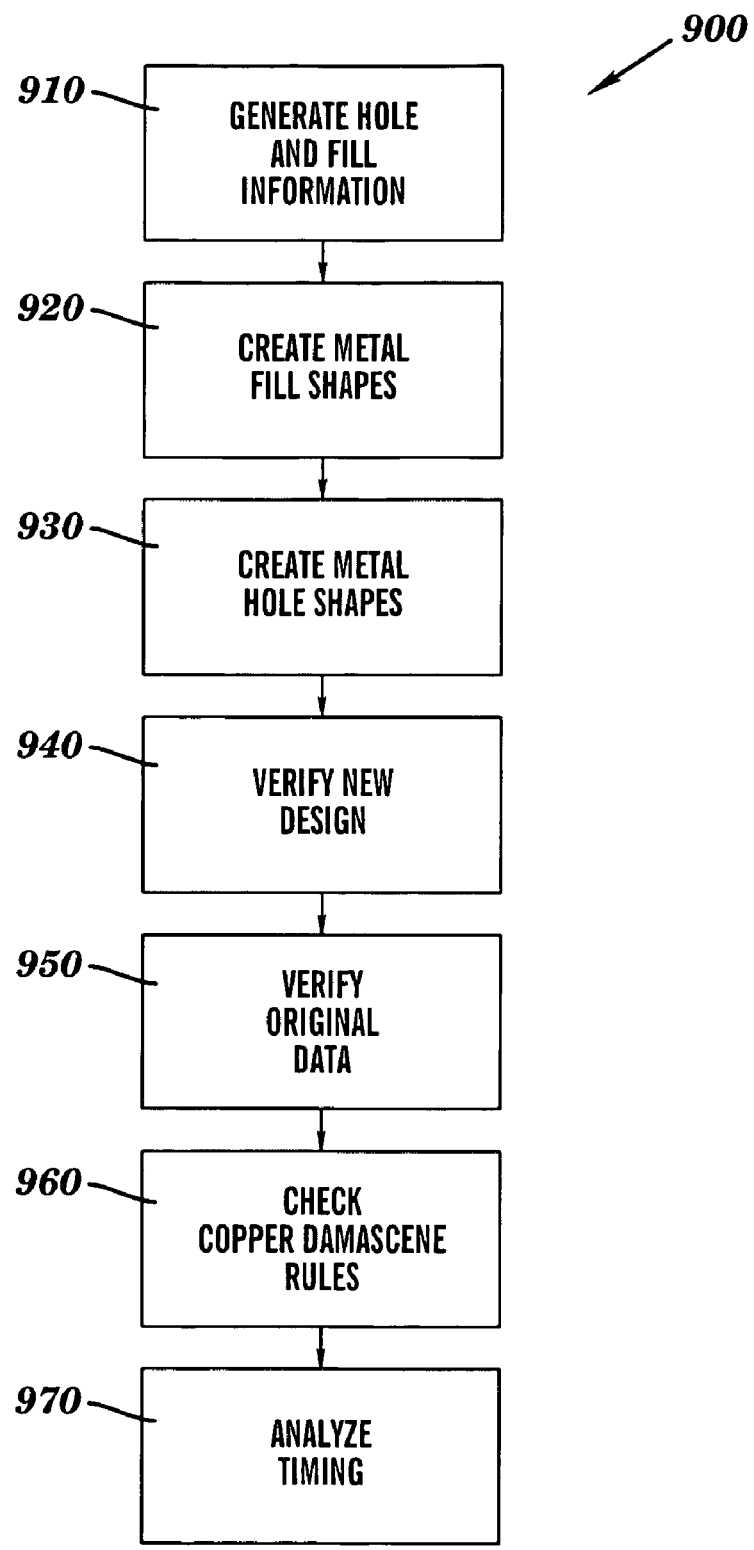
FIG. 9 is a flow chart of the method of the present invention.

FIG. 9 is a flow chart of the method of the present invention and begins with the group of steps comprising the generation 910 of hole and fill information. Initially, it is necessary to identify regions from which metal fill shapes and/or metal hole shapes must be excluded. These include identification of logo regions and fuse bays (identified as openings in the final passivation that are not covered by metal). An embodiment of this step is illustrated in FIG. 7.

Next, metal fill shapes are created 920 for each wiring level. Metal fill shapes are placed wherever there is enough empty space on a given wiring level to accommodate them. Metal fill shapes are generally kept at least as far away from "real" metal shapes on that level as the standard minimum space that has been defined in the design rules for that metal layer. Design rules include, but are not limited to, rules stating the minimum and maximum shape widths and minimum spaces between shapes allowed for each level of the design. Design rules are based on the process limits of the technology being used to manufacture the semiconductor design. Regions of whitespace (i.e., wide regions devoid of metal wires) that could possibly accommodate metal fill shapes are located by expanding all metal shapes by the Mx/MxFILL design rule set-back per edge (i.e., at least standard minimum distance a metal fill shape can be from and edge of a metal wire for that level), and taking the complement of the unioned result. Metal fill shapes of a preferred size are then placed within the "region-to-be-filled" complement shapes, on a specified pattern or grid. If a metal fill shape does not fit entirely within the allotted region-to-be-filled, it is discarded entirely. That is, only whole MxFILL shapes are retained. The preferred shape for MxFILL is a square that is three times the minimum-width, and the preferred layout pattern is an offset-grid with a pitch equal to twice the Mx minimum space. Using this fill size and pattern, the maximum local MxFILL-pattern-density in a region of fill is the preferred value of about 45%.

Figure 8:
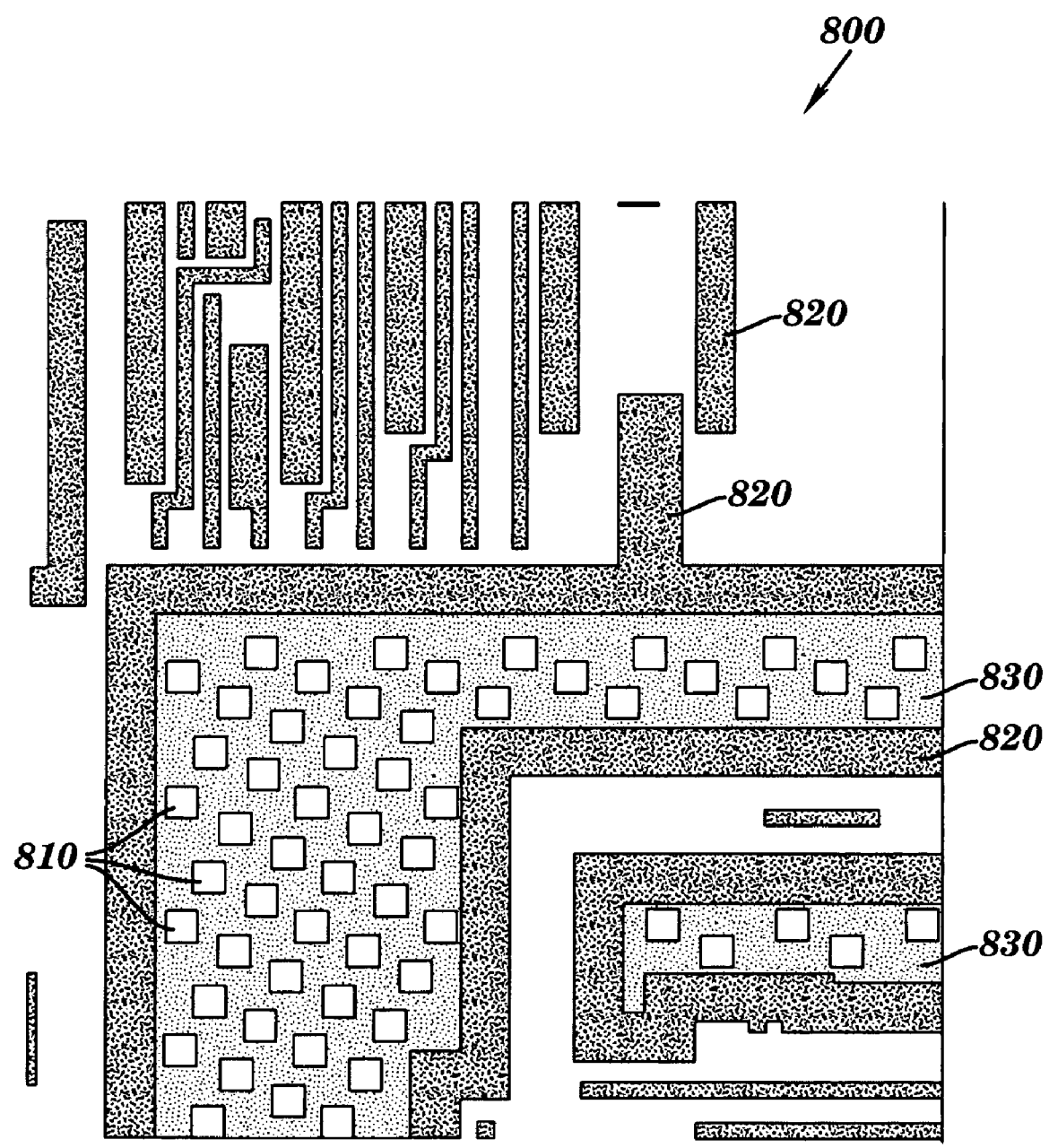
FIG. 8 is a plan view of a typical MxHOLE pattern, depicting a preferred size and grid.

In the next step, metal hole shapes are created 930 for each wiring level. Metal hole shapes are placed in the interior of all wide metal wires where there is sufficient room to accommodate them. Metal hole shapes are generally kept at least as far away from the inside edge of metal wires as standard minimum linewidth for that wiring level. Further, metal hole shapes are kept at least as far away from non-redundant vias (on the via levels directly above or directly below the wiring level of interest) as required by standard via-coverage rules. Regions of wide metal wires that could possibly accommodate metal hole shapes are located by shrinking all metal wire shapes by the Mx/MxHOLE design rule set-in per edge (i.e., at least standard minimum distance a metal hole shape can be from an edge of a metal wire for that level), and subtracting from those metal wire shapes the non-redundant via shapes (expanded by the Via/MxHOLE design rule set-back per edge). Metal hole shapes of a preferred size are then placed within the resulting "region-to-be-cheesed" shapes, on a specified pattern or grid. If a metal hole shape does not fit entirely within the allotted region-to-be-cheesed, it is discarded entirely. That is, only whole MxHOLE shapes are retained. One shape for MxHOLE is a square that is two-times the minimum-space (i.e., per edge); and the preferred layout pattern is an offset-grid with a pitch equal to twice the Mx minimum space. Using this hole size and pattern, the maximum local metal-pattern-density in a region containing shapes is 80%; or equivalently the maximum MxHOLE density is 20%. An embodiment of this step is illustrated in FIG. 8.

Once these steps are completed, all generated fill and hole shapes are collected. This collection is then merged with original design data. This step is performed by standard shapes-processing means and tools, as are well known in the art.

Steps 940 and 960 utilize DRC which will be discussed before describing steps 940 and 960. Integrated circuits must be laid out so that components (i.e., resistors, transistors, diodes, capacitors, and the like) and wiring between the components do not intersect at undesired locations but do have sufficient spacing between them to operate reliably. To meet these requirements, integrated circuit layout checking is performed using a computer program applying a DRC algorithm. DRC can require checking millions or even hundreds of millions of geometric shapes to verify that they satisfy the closeness requirements (i.e., design rules) for reliable operation of the integrated circuit being designed.

DRC algorithms typically perform Boolean operations such as intersection, union, and difference using polygons to represent the components and wiring on the integrated circuit. In many DRC implementations, the polygons are represented using long or integer coordinates. When Boolean operations such as intersection, union, and difference are performed using these polygons, vertex coordinates are computed by intersecting two edges using floating point computations. Then, these vertex coordinates are rounded to long or integers for the output polygon. As a result of this rounding, the output polygons can intersect spuriously. For example, an output polygon can self-intersect to create a bow-tie, or an inside loop can intersect an outside loop that is supposed to enclose the inside loop. These spurious intersections, create undefined or ill defined point-sets, resulting in ambiguous or wrong answers for DRC operations.

Many DRC algorithms operate on the assumption that the output of the Boolean operations that form the foundation of these algorithms are regular and well-defined point sets, and that these point-sets are defined by well-defined polygonal boundaries. Round-off errors during Boolean computations can cause algorithm failures without warning. These undetected errors can cause severe consequences, including wasted computation time due to ambiguous or wrong results or even defective dies due to undetected errors.

DRC are checks performed before integrated circuit manufacturing to ensure that in the placed and routed technology mapped design (the actual dimensions and locations of the shapes making up a wire or other feature in the chip) none of the rules of the target technology process is violated. Examples for such DRC are checks for shorts, spacing violations, or other design-rule problems between logic cells. An example for a tool that does DRC is Dracula from Cadence Design Systems, Inc. in San Jose, Calif.

Figure 4:
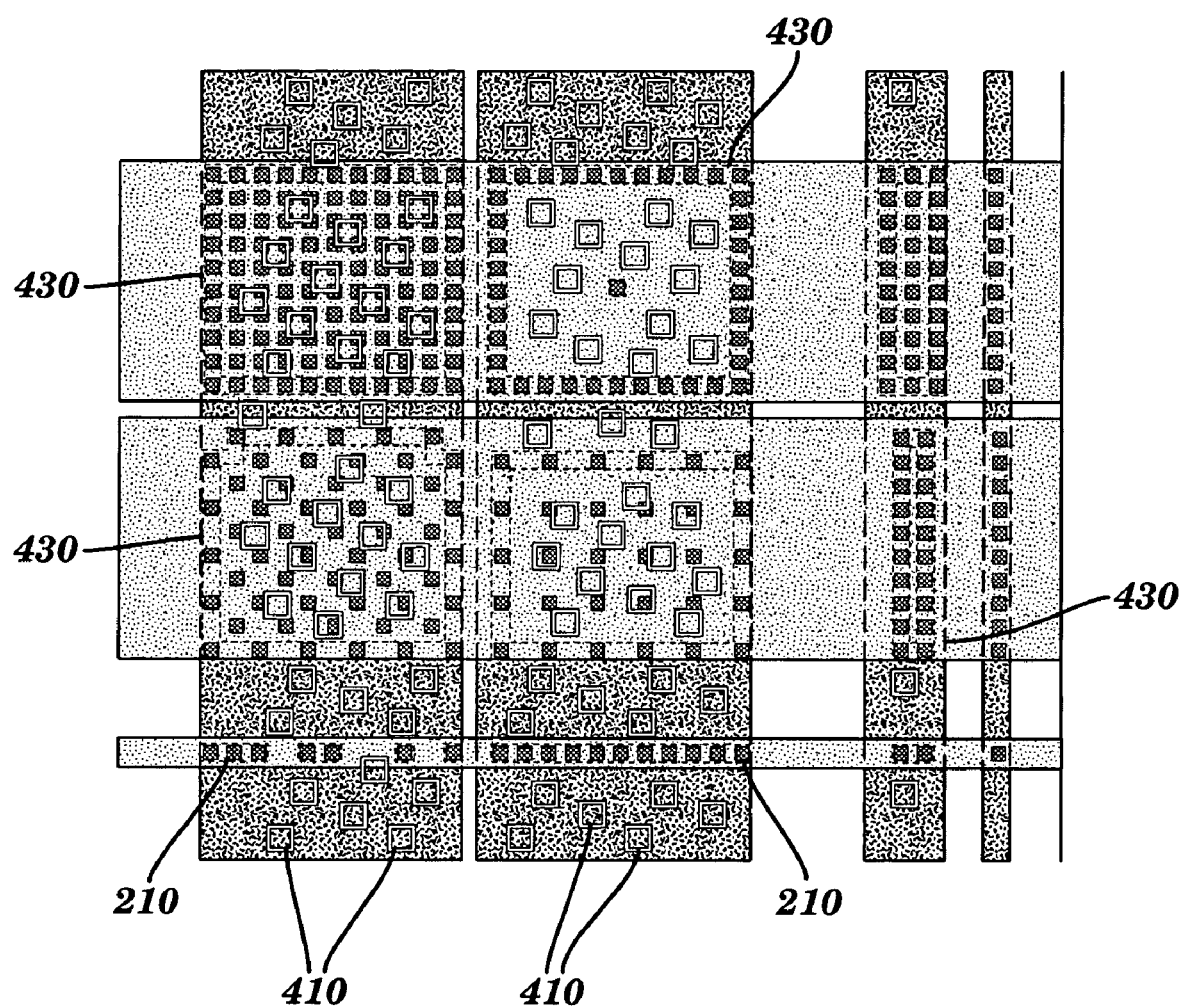
FIG. 4 is a plan view of two metal layers and a via layer depicting M1HOLE shapes which must avoid V1_Block_M1 and must avoid the perimeter of V1FARM.

The group of steps comprising design verification 940 are performed next. First, the construction of generated metal fill shapes and metal hole shapes is done using standard DRC tools to verify that the following prescribed values are observed: MxFILL outside Mx; MxFILL outside MxEXCLUD (e.g., logos, fuse bays); MxHOLE inside Mx; MxHOLE outside Vx, Vx-1; MxHOLE outside MxCHEXCL, where for example, "M1FILL outside M1" refers to a rule requiring that all M1FILL shapes must lie outside any M1 shape by at least a prescribed minimum distance. Similarly, "M2HOLE inside M2" refers to a rule requiring that all M2HOLE shapes are entirely inside M2 by at least a prescribed minimum distance. An embodiment of this step is illustrated in FIG. 4.

Step 950 utilizes LVS tools which will be discussed before describing step 950. Integrated circuit layouts define the physical implementation of the logical functions defined in the circuit schematic. To assure that the physical layout is an accurate representation of the circuit schematic, a LVS check is performed using a computer program.

LVS programs typically use the physical layout shapes to extract the circuit implemented by the layout and compare the circuit so extracted to the circuit specified in the schematic. This verifies that the circuit specified by the circuit designer is accurately represented by the shapes included in the integrated circuit layout.

LVS checks are performed before integrated circuit manufacturing to ensure that the physical implementation of the circuit will perform the desired function. An example of a tool that does LVS checking is Calibre LVS from Mentor Graphics.

Next, checking of the integrity of the original data levels is performed 950 using LVS tools to repeat the verification of the data levels present in the original design, including everything except the generated MxFILL and MxHOLE.

Figure 5:
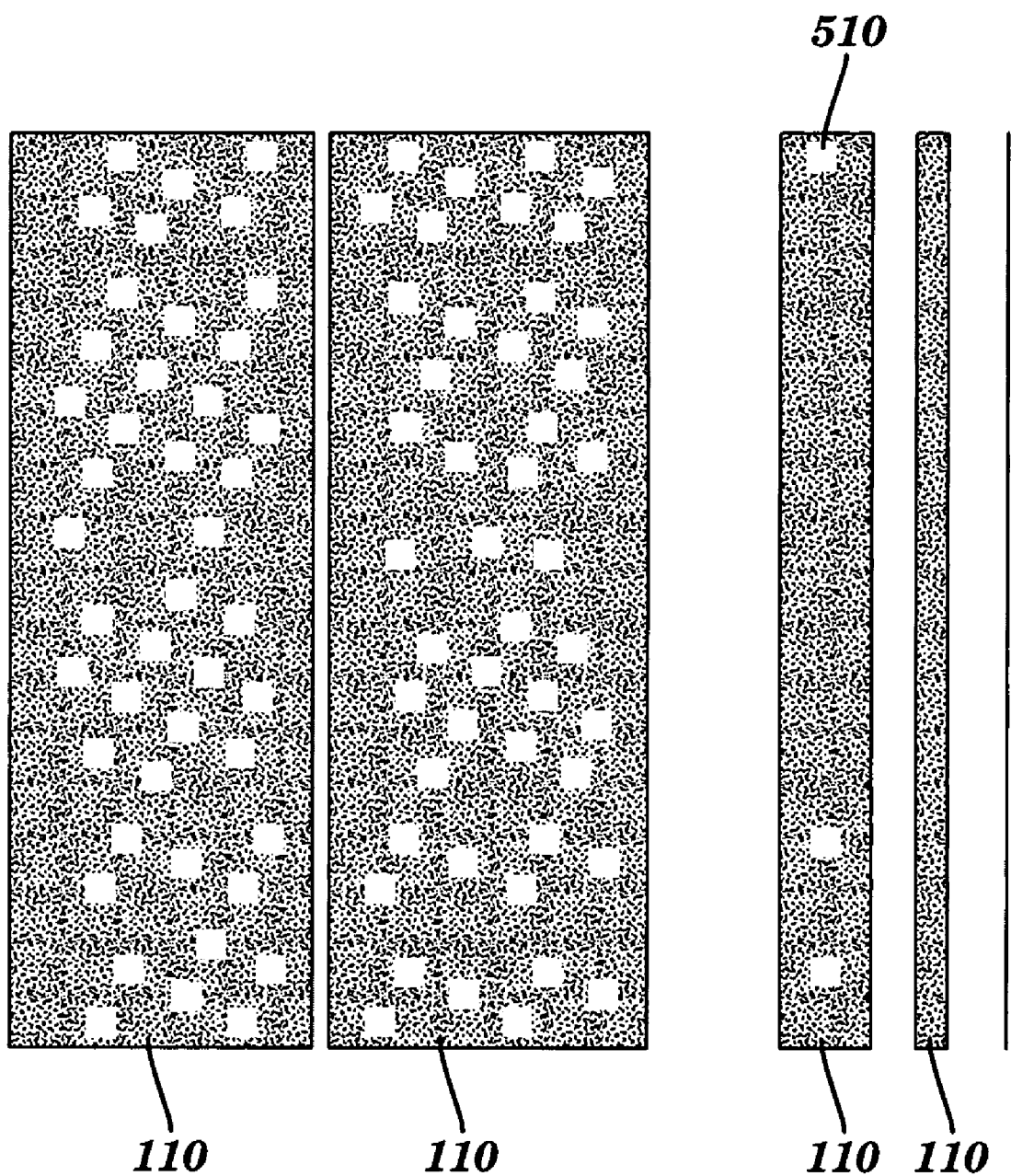
FIG. 5 is a plan view of two metal layers and a via layer depicting the resulting M1 layer, with M1HOLE shapes resolved.

Then, a check may be performed 960 to ensure that the resulting metal satisfies copper damascene rules of maximum and minimum local metal density (ratio of metal wire area to total area of a local region). The term "local region" refers to a region of the design having a predefined geometry and area. For example, the local metal density may be determined in a first region of the design having, for example a width of 100 microns and a length of 100 microns. Then a second 100 micron wide by 100 micron long region, adjacent to the first region, is checked. The first and second region may overlap by up to 50% of width or length of the local region, though the overlap may be zero. The size and overlap of local regions is based on the technology being used to fabricate the level. Using standard DRC tools, it can be verified that the wide-line/wide-space and local-metal-pattern-density rules are observed (or can be waived) for the resolved metal, where metal density=Mx density+MxFILL density−MxHOLE density. An embodiment of this step is illustrated in FIG. 5.

The next step 970 is to optionally analyze the timing of the modified layout design. This step is not required in all cases, since in general, electrical perturbations due to metal fill shapes and metal hole shapes are modest and predictable. Thus, timing adjustments are not generally needed after MxFILL and MxHOLE generation.

In those applications where it is necessary to analyze the timing, it should be noted that MxFILL shapes, as described herein, are virtually transparent to the circuit. In virtually all cases, the change in capacitance of a signal wire due to the presence or absence of nearby metal fill is very much smaller than the capacitance changes associated with the specified process tolerances for CMOS technologies. In general, metal fill shapes do not affect the timing of a design.

Metal hole shapes, as described above, do not affect the resistance of narrow lines. Narrow lines are defined as too small to receive MxHOLE shapes, typically less than six times the minimum design rule linewidth. Wide lines are defined as wide enough to possibly receive MxHOLE shapes, typically, six times the minimum design rule linewidth. Since most timing tools are not able to accommodate either a linewidth-dependent sheet resistance, or a pattern-density-dependent sheet resistance (Rs), a designer must choose a single value for the Rs of all the wires, regardless of their width. The standard choice is the Rs for minimum width wires, as those minimum-width wires make up the vast majority of interconnects in a standard design. For these designs, the presence or absence of MxHOLE shapes does not affect any of the parameters used in timing analyses. Similarly, pattern-density, linewidth and nested/isolated effects on Rs are normally ignored. For those designers with more sophisticated timing tools, the effects of MXHOLE shapes can be modeled as a linewidth-dependence on Rs or, more practically, as a linewidth-dependent etch bias. These dependencies are normally known well in advance, and anticipated in the initial circuit timings, thus obviating the need for retiming analysis after MXHOLE generation.

Figure 1:
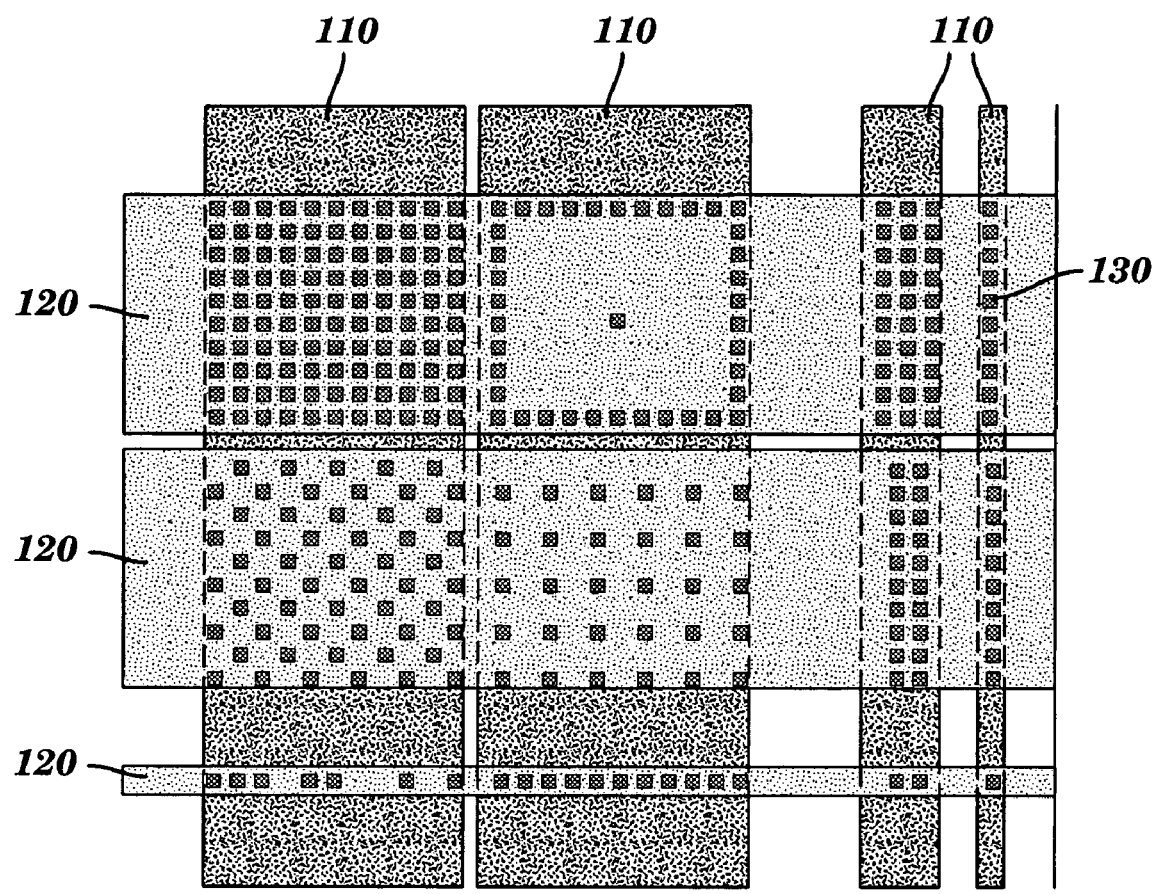
FIG. 1 is a plan view of two metal layers and a via layer.

Referring now to FIG. 1, an initial embodiment of the structure and steps of the invention is presented. Regions 110 represent metal wires of a first layer M1. Regions 120 represent metal wires of a second layer M2 which is distinct and electrically isolated from M1, except where electrical connection is made between M1 and M2 by V1 vias 130.

FIGS. 2, 3, 4, 5 and 6 all illustrate the same region of a semiconductor design at different stages of the design.

Figure 2:
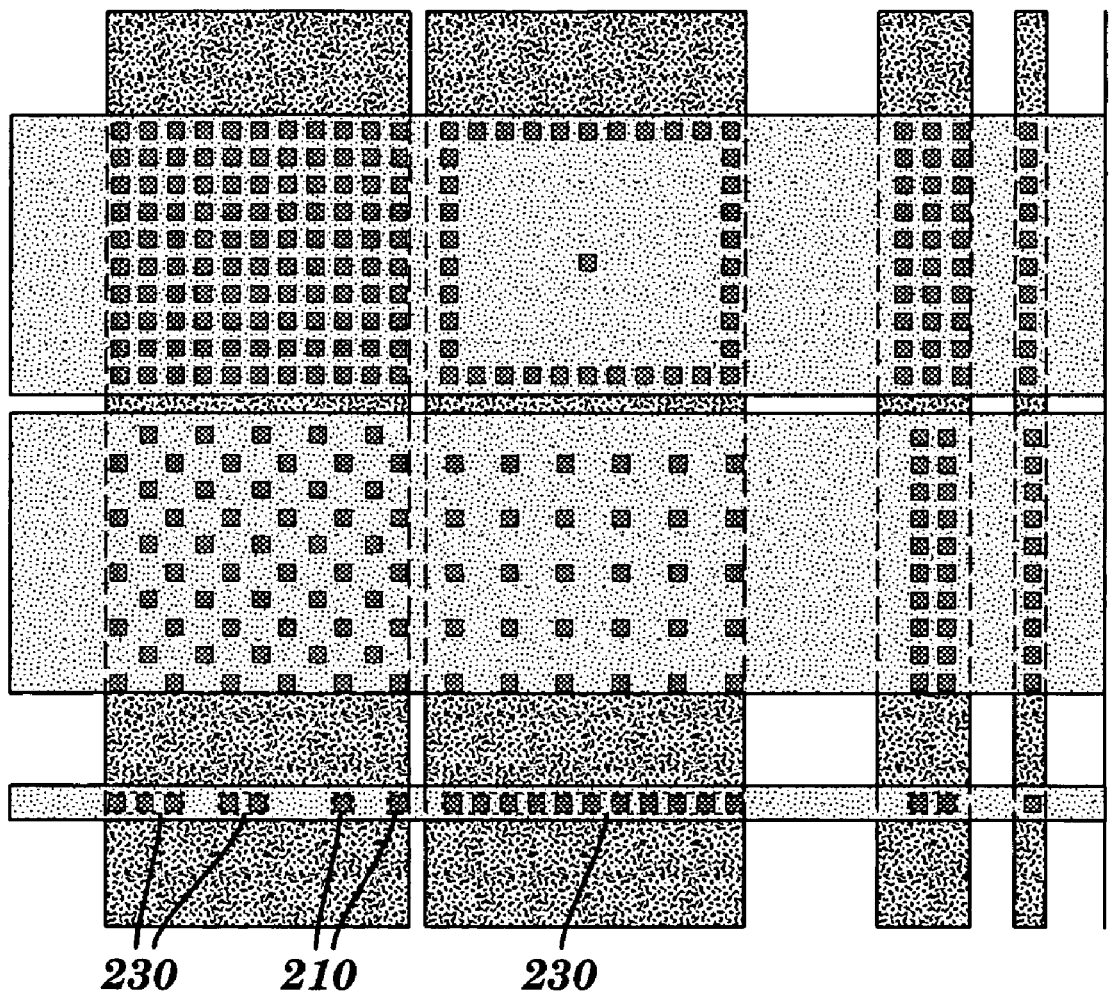
FIG. 2 is a plan view of two metal layers and a via layer wherein there are V1BlockM1 shapes.

Referring now to FIG. 2, via blockages 210 are identified and illustrated as new levels such as V1BlockM1, V1BlockM2. Via blockages are vias that prevent placement of a metal hole shape. V1BlockM1 blocks metal hole shapes being placed in a metal line in first layer M1 and V1BlockM2 blocks metal hole shapes being placed in a metal line of second layer M2, where V1 designates the vias connecting M1 metal wires to M2 metal wires. For each via level, all vias that contact wide metal wires above, or wide metal wires below (but not both) are identified. That is, both the M1 and the M2 metal wires cannot both be wide metal wires.

N.B. For the sake of this disclosure, "wide metal" is defined as any metal structure wide enough in its minor dimension to possibly accommodate a metal hole shape. For standard metal hole parameters (preferred dimensions and layout grid), a line is "wide" if it is at least six times the minimum linewidth for the wiring level in question.

Also shown in FIG. 2 is the result of an optional step of combining adjacent vias, which results in combined vias 230. For each via level, for the set of vias that contacts wide metal only above, and separately for the set of vias that contacts wide metal only below, expand and then shrink those via shapes by the VxBlockage Spacing, per edge. Then union the result, to simplify overlapping and abutting shapes. This has the effect of representing a row of vias with their least enclosing rectangle, which can greatly improve the computational efficiency of later steps. The preferred value for VxBlockageSpacing is (2*MxHole_setback_from_Vx+MxHole_size)/2, which is approximately equal to the via size, assuming preferred values for MxHOLE_setback_from_Vx and MxHOLE_size. In any case, the smallest useful value for VxFarmSpacing (i.e., a distance characterizing the largest spacing between vias in a redundant via) is one-half of the via minimum space.

Figure 3:
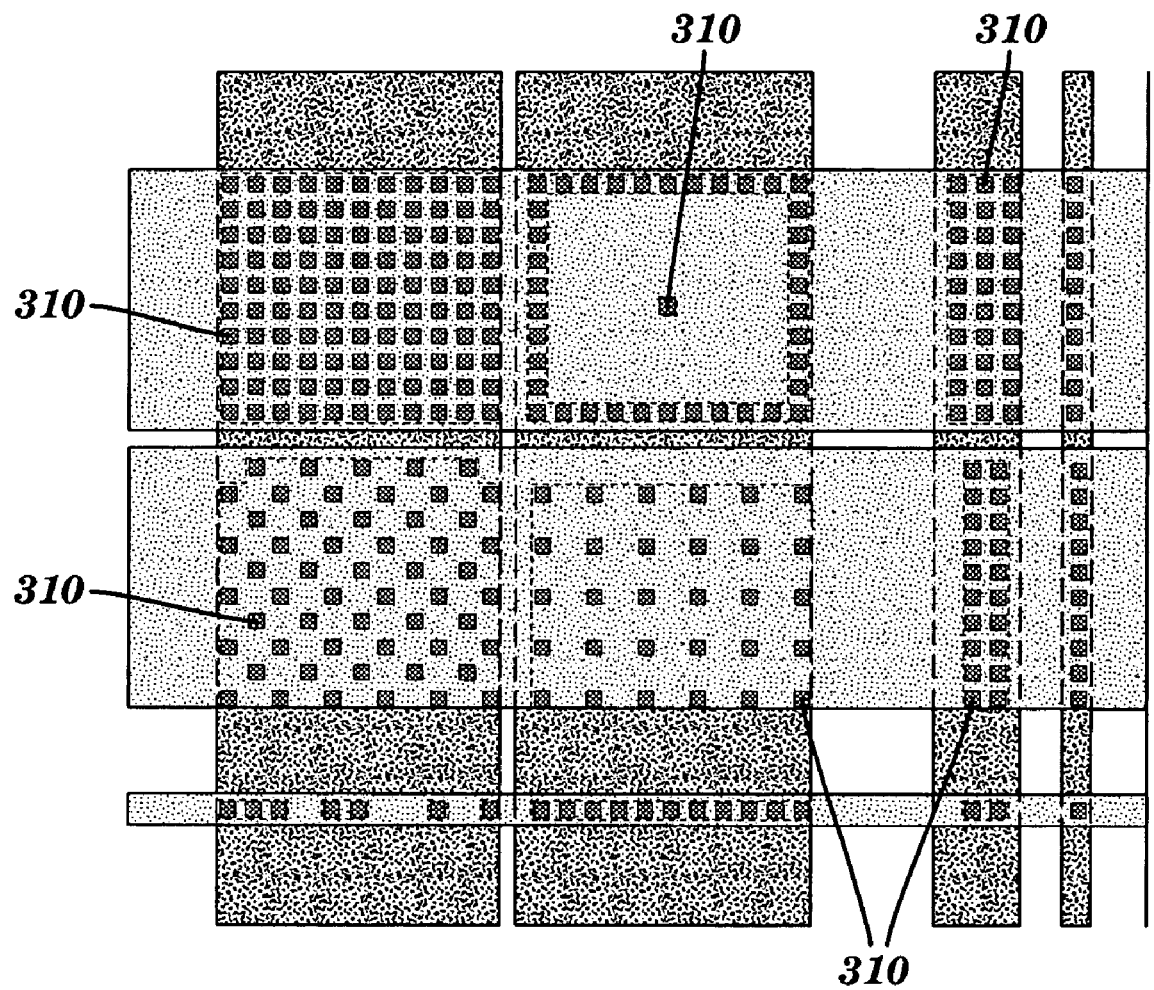
FIG. 3 is a plan view of two metal layers and a via layer wherein there are V1Farm shapes;.

Referring to FIG. 3, via farms are identified and new levels such as V1Farm 310 are defined by the least enclosing polygon of the via farm. That is, for each via level, identify all vias that contact wide metal above and wide metal below. Potential VxFarms are identified as vias that contact both. For each via level, for the set of vias that contacts both wide metal above and below, expand and then shrink those via shapes by the VxFarmSpacing, per edge. For the MxHOLE layout grid, one value for VxFarmSpacing is (3*MxHOLE-pitch−MxHOLE_size)/2, or two times the Mx minimum linewidth (which is typically equal-to the HOLE size), assuming preferred values for MxHOLE_size and MxHOLE_pitch. In any case, the smallest useful value for VxFarm Spacing is one-half of the via minimum spacing.

Referring to FIG. 4, next, actual via farms are identified. For each potential via farm shape, intersect those shapes with wide metal above and with wide metal below. Each resulting shape completely covers the collection of tightly-spaced redundant vias connecting a single piece of wide metal above with a single piece of wide metal below.

Then MxHOLE shapes (e.g., M1HOLE 410) are placed, avoiding via blockage shapes (e.g., V1BlockM1 210), and avoiding vias in the perimeter of via farm 430 shapes. Note MxHOLE shapes are arranged in a offset grid. An offset grid is defined as a grid where repeating patterns of rows are displaced in the column wise direction from each other. In FIG. 4, every other row of M1HOLEs 410 are aligned in both the columnwise and row wise directions, but adjacent rows are offset in the columnwise direction from each other.

During manufacture, the intersection of a Vx shape with a MxHOLE shape (on the wiring level below) is not resolved as an electrical connection between the two wiring levels. That is, the intersection is not useful as a via (it does not connect to Mx+1). The intersection of a via with a metal hole shape in the level above may resolve as an electrical connection, depending on the process. In either case, no unusual defect or reliability issues result from any possible intersection of vias in a via farm with hole shapes in wide metal above or below.

If the MxHOLE local density is small (e.g., about 20%), then only a small fraction of the area of the vias 130 will be lost from the interior of a normally-constructed via farm 430. In general, only 25% or less of the hole area on level Mx can be lost due to interactions with vias in the interior of a via farm.

FIG. 5 depicts a resulting M1 metal layer 110 wherein the M1HOLE shapes 510 are resolved M1HOLE shapes 410 of FIG. 4.

Figure 6:
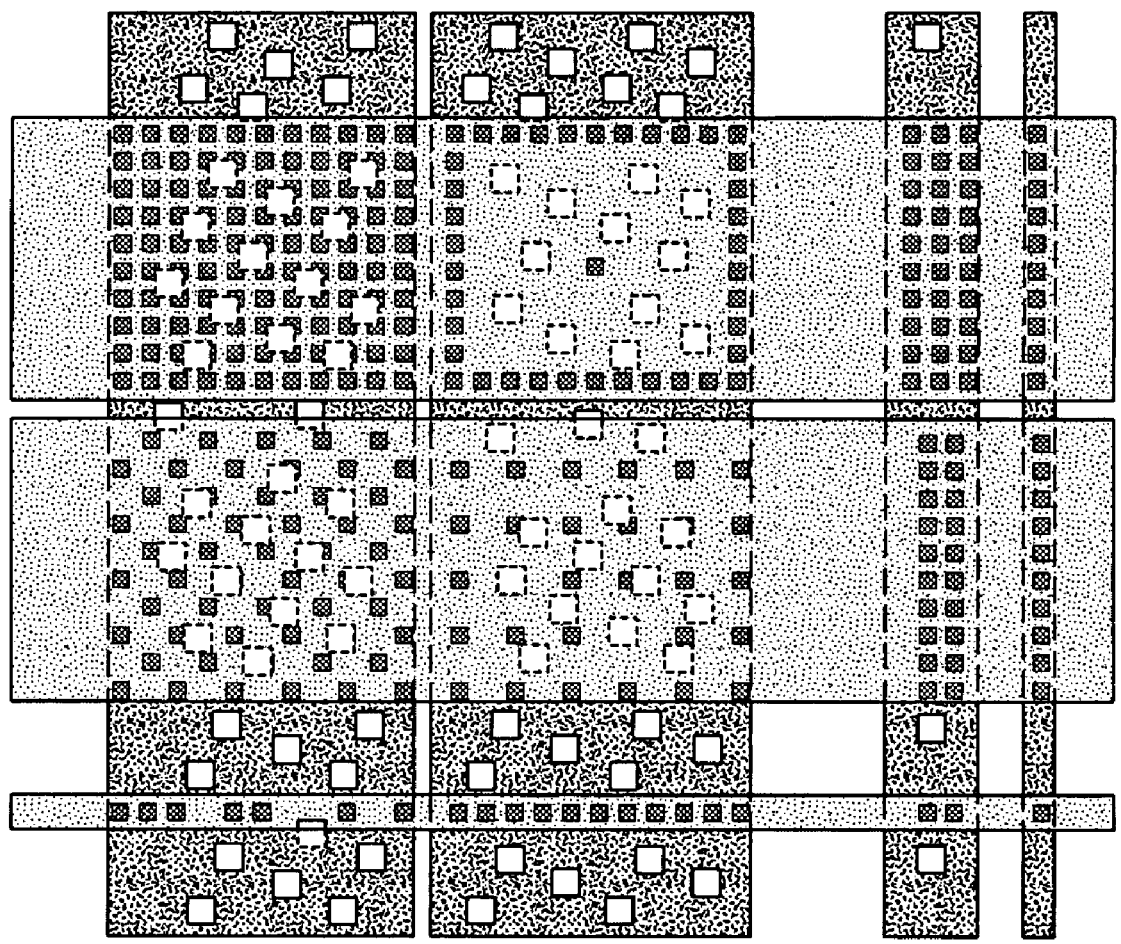
FIG. 6 is a plan view for the preferred MxHOLE size and layout.

FIG. 6 illustrates that for the MxHOLE size and layout (resulting in 20% maximum local MxHOLE density), a typical via farm will lose 20% of the via area from the interior of a via farm. Up to 25% of the MxHOLE density will be lost, depending on the local via density.

FIG. 7 shows a typical MxFILL pattern 720 of one size and grid. "Real" (or functional, signal carrying metal wires) metal shapes 710 are included for reference.

FIG. 8 depicts a typical MxHOLE pattern 810 of a typical size and grid. Mx shapes 820 and "region-to-be-cheesed" shapes 830 are included for reference. In FIG. 8, darker shading indicates metal wires or region of metal wires that can not be "cheesed" because they are to narrow to fit a metal hole shape or too close to an edge of a metal line.

Figure 11:
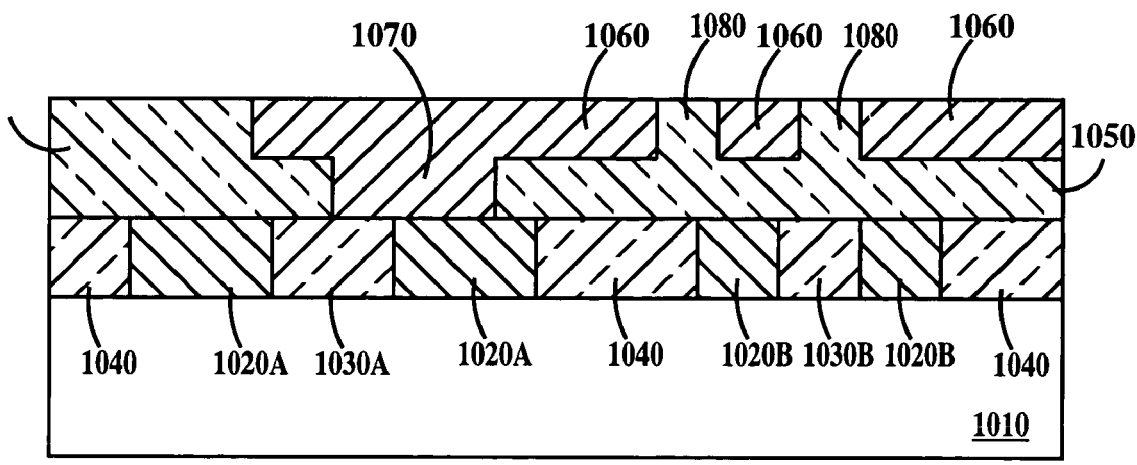
FIG. 11 illustrates a second metal wire interconnecting to the first metal line of FIGS. 10A and 10B of a physical representation of the present invention.

FIG. 11 illustrates a second metal wire interconnecting to the first metal wire of FIGS. 10A and 10B of a physical representation of the present invention. In FIG. 11 . In FIG. 11, a dielectric layer 1050 is formed over dielectric layer 1040 and metal wires 1020A and 1020B and dielectric pedestals 1030A and 1030B. Formed in dielectric layer 1050 is a dual damascene metal wire 1060 having an integral via region 1070. Only integral via region 1070 extends the entire thickness of dielectric layer 1050, not other regions of dual damascene metal wire 1060 so only via region 1070 is in direct physical and electrical contact with metal wire 1020A. For exemplary purposes, via 1070 is also in direct physical contact with dielectric pedestal 1030A. However, via 1070 could just as easily not be in physical contact with dielectric pedestal 1030A. Dual damascene metal wire 1060 includes dielectric pedestals 1080. Dielectric pedestals 1080 are formed from dielectric layer 1050 and correspond to metal hole shapes of the embodiments of the present invention. Thus, as more metal wiring levels are built up, metal hole shapes (as well as metal fill shapes) may be added to each wiring level design.

Returning to FIG. 10A, metal wire 1020A has a width W1 and fill shapes 1030A have a width W2. Metal wire 1020B has a width W3 and fill shapes 1030B have a width W4. W4. W1, W2, W3 and W4 are measured in parallel directions. In one example, the ratio of W1/W2 is equal to the ratio W3/W4. Dielectric pedestals 1030A are separated by a distance S1 and dielectric pedestals 1030B are separated by a distance S2. In one example, the ratio of W2/S1 is equal to the ratio W4/S2. In one example, the ratio of W1/W2 is equal to the ratio W3/W4 and the ratio of W2/S1 is equal to the ratio W4/S2.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method of manufacturing an integrated circuit, comprising:

providing a dielectric layer having a bottom surface disposed over a semiconductor substrate;

forming a metal filled trench filled with a layer of metal in said dielectric layer, said metal filled trench extending from a top surface of said dielectric layer toward said bottom surface of said dielectric layer;

forming a plurality of square dielectric pedestals in said metal filled trench, said dielectric pedestals filled with said dielectric layer, said dielectric pedestals extending from a top surface of said metal filled trench to a bottom surface of said metal filled trench;

forming an additional trench filled with said layer of metal disposed in said dielectric layer, said additional metal filled trench extending from a top surface of said dielectric layer toward said bottom surface of said dielectric layer;

forming a plurality of additional square dielectric pedestals disposed in said metal filled trench, said additional dielectric pedestals filled with said dielectric layer, said additional dielectric pedestals extending from a top surface of said metal filled trench to a bottom surface of said metal filled trench; and said metal filled trench having a first width, said dielectric pedestals having a second width less than said first width, said additional metal filled trench having a third width, said additional dielectric pedestals having a fourth width less than said third width, wherein said first width divided by said second width is equal to said third width divided by said fourth width.

2. The method of claim 1, wherein said layer of metal comprises copper.

3. The method of claim 1, wherein said metal filled trench and said dielectric pedestals extend to said bottom surface of said dielectric layer.

4. The method of claim 1, wherein a first region of said trench extends to said bottom surface of said dielectric layer and wherein a second region of said trench and said dielectric pedestals do not extend to said bottom surface of said dielectric layer.

5. The method of claim 1, wherein a length of each side of said dielectric pedestals is three times a design rule minimum width for said metal filled trench.

6. The method of claim 1, wherein the combined areas of said dielectric pedestals divided by the area of metal filled trench does not exceed 0.20.

7. The method of claim 1, further comprising:
forming a plurality of metal fill shapes filled with said layer of metal disposed in said dielectric layer, said metal fill shapes extending from a top surface of said dielectric layer toward said bottom surface of said dielectric layer.

8. The method of claim 7, wherein the ratio of an area of all metal fill shapes in an region devoid of wire shapes divided by an area of said region devoid of wire shapes is about 0.45.

9. A method of designing an integrated circuit, comprising:
generating a wiring level design of each wiring level and a via level design of each via level of said integrated circuit, each wiring level design having wire shapes, each via level design having via shapes;
for each wiring level design, determining empty regions, said empty regions devoid of wire shapes;
for each wiring level design, generating metal fill shapes and a metal fill shape grid; for each wiring level design, determining first and second regions of wire shapes;
for each wiring level design, generating metal hole shapes and a metal hole shape grid;
for each wiring level design, placing said generated metal fill shapes between said wire shapes in corresponding empty regions and on a corresponding metal fill shape grid; and
for each wiring level design, placing said generated metal hole shapes within said wire shapes in corresponding second regions of wire shape on a corresponding hole fill shape grid.

10. The method of claim 9, wherein only whole metal fill shapes are placed.

11. The method of claim 9, wherein only whole metal hole shapes are placed.

12. The method of claim 9, further comprising:
for each wiring level design, providing copper damascene rules of maximum and minimum local metal density for predetermined regions of each wiring level; and
performing a design rule check of each wiring level design to ensure that a corresponding resultant wiring level design conforms to a corresponding copper damascene rule of maximum and minimum local metal density.

13. The method of claim 9, wherein, for each wiring level design, said metal hole shapes are not placed closer to edges of wire shapes than a distance equal to a corresponding wiring level design rule minimum line width of wire shapes.

14. The method of claim 9, wherein, for each wiring level design, said hole fill shapes are not placed in wire shapes less than six times a corresponding wiring level design rule minimum line width of wire shapes.

15. The method of claim 9, further including:
from each via level design, generating a corresponding via blockage design, each via blockage design indicating blocked positions that a hole shape in a corresponding position in an immediately lower or immediately higher wiring level design may not be placed.

16. The method of claim 15, wherein blocked positions are allowed if corresponding position in said immediately lower or immediately higher wiring level design is in a wire shape equal to greater than six times a corresponding wiring level design rule minimum line width of wire shapes.

17. The method of claim 9, further including:
from each via level design, generating a corresponding via farm design, each via farm design indicating blocked positions that a hole shape in a corresponding position in an immediately lower or immediately higher wiring level design may not be placed, said blocked positions corresponding to via shapes adjacent to a perimeter of a via farm.

* * * * *